United States Patent
Tashiro et al.

(10) Patent No.: US 10,757,350 B2
(45) Date of Patent: Aug. 25, 2020

(54) SOLID-STATE IMAGE PICKUP DEVICE AND ELECTRONIC APPARATUS

(71) Applicant: SONY SEMICONDUCTOR SOLUTIONS CORPORATION, Kanagawa (JP)

(72) Inventors: Yoshiaki Tashiro, Kanagawa (JP); Yorito Sakano, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 10 days.

(21) Appl. No.: 15/745,385

(22) PCT Filed: Jul. 15, 2016

(86) PCT No.: PCT/JP2016/070934
§ 371 (c)(1),
(2) Date: Jan. 16, 2018

(87) PCT Pub. No.: WO2017/022451
PCT Pub. Date: Feb. 9, 2017

(65) Prior Publication Data
US 2019/0098236 A1 Mar. 28, 2019

(30) Foreign Application Priority Data
Jul. 31, 2015 (JP) .................... 2015-151618

(51) Int. Cl.
*H04N 5/363* (2011.01)
*H04N 5/355* (2011.01)
(Continued)

(52) U.S. Cl.
CPC ....... *H04N 5/363* (2013.01); *H01L 27/14643* (2013.01); *H04N 5/343* (2013.01);
(Continued)

(58) Field of Classification Search
CPC .... H04N 5/355; H04N 5/35563; H04N 5/378; H04N 5/363; H04N 5/335; H04N 5/343;
(Continued)

(56) References Cited

U.S. PATENT DOCUMENTS

| | | | | |
|---|---|---|---|---|
| 6,538,693 B1 * | 3/2003 | Kozuka | ................. | H04N 5/363 348/241 |
| 7,218,675 B1 * | 5/2007 | Takahashi | .......... | H04N 5/23248 348/155 |

(Continued)

FOREIGN PATENT DOCUMENTS

| | | |
|---|---|---|
| CN | 1162888 A | 10/1997 |
| CN | 104885223 A | 9/2015 |

(Continued)

OTHER PUBLICATIONS

Ni, et al., "A 768x576 Logarithmic Image Sensor With Photodiode in Solar Cell Mode", New Imaging Technologies SA, 04 pages.

(Continued)

*Primary Examiner* — Albert H Cutler
(74) *Attorney, Agent, or Firm* — Chip Law Group

(57) ABSTRACT

A solid-state image pickup device and an electronic apparatus that enable the performance of a logarithmic sensor in a solar-cell mode to improve. After Signal (S) is read, a P-phase signal (N) is read in a conducted state in which RST is ON, and a P-phase signal (N') is read in a non-conducted state in which the RST is OFF. Thus, in a case where sufficient incident light illuminance is provided (Bright), S-N being the difference with respect to the P phase acquired in the conducted state in which the RST is ON, is selected and output. In a case where capacitance is insufficiently charged in a low-illuminance condition in which the incident light is less in amount (Dark), S-N' being the difference with
(Continued)

respect to the P phase acquired in the conducted state in which the RST is OFF, is selected and output.

15 Claims, 14 Drawing Sheets

(51) Int. Cl.
    *H04N 5/343* (2011.01)
    *H04N 5/357* (2011.01)
    *H01L 27/146* (2006.01)
    *H04N 5/374* (2011.01)
    *H04N 5/351* (2011.01)

(52) U.S. Cl.
    CPC .............. *H04N 5/351* (2013.01); *H04N 5/357* (2013.01); *H04N 5/35518* (2013.01); *H04N 5/374* (2013.01)

(58) Field of Classification Search
    CPC ............... H04N 5/351; H04N 5/35509; H04N 5/35518; H04N 5/369; H04N 5/374; H04N 5/3745; H01L 27/14643; H01L 29/42372
    See application file for complete search history.

(56) References Cited

U.S. PATENT DOCUMENTS

| | | | | |
|---|---|---|---|---|
| 7,995,113 | B2* | 8/2011 | Karim | .................... H04N 3/155 348/229.1 |
| 9,055,246 | B2* | 6/2015 | Tay | ................... H01L 27/14603 |
| 2004/0253761 | A1* | 12/2004 | Rhodes | ............. H01L 27/14601 438/84 |
| 2006/0181627 | A1* | 8/2006 | Farrier | ............... H01L 27/14603 348/308 |
| 2008/0277700 | A1* | 11/2008 | Kawahito | ......... H01L 27/14609 257/292 |
| 2011/0226935 | A1* | 9/2011 | Kawahito | ......... H01L 27/14603 250/208.1 |
| 2014/0175264 | A1* | 6/2014 | Xue | ........................ H04N 5/347 250/208.1 |
| 2014/0239161 | A1* | 8/2014 | Meynants | .............. H04N 5/353 250/214 SW |
| 2015/0281621 | A1 | 10/2015 | Ni | |
| 2017/0118429 | A1* | 4/2017 | Ni | ...................... H01L 27/1461 |

FOREIGN PATENT DOCUMENTS

| | | |
|---|---|---|
| FR | 2997596 A1 | 5/2014 |
| JP | 09-205588 A | 8/1997 |
| JP | 2002-170982 A | 6/2002 |
| JP | 2010-178117 A | 8/2010 |
| JP | 2013-058960 A | 3/2013 |
| JP | 2015-534407 A | 11/2015 |
| KR | 10-0206099 B1 | 7/1999 |
| WO | 2014/064274 A1 | 5/2014 |

OTHER PUBLICATIONS

International Search Report and Written Opinion of PCT Application No. PCT/JP2016/070934, dated Sep. 27, 2016, 14 pages of ISRWO.

* cited by examiner

SOLID-STATE IMAGE PICKUP DEVICE AND ELECTRONIC APPARATUS

CROSS REFERENCE TO RELATED APPLICATIONS

This application is a U.S. National Phase of International Patent Application No. PCT/JP2016/070934 filed on Jul. 15, 2016, which claims priority benefit of Japanese Patent Application No. JP 2015-151618 filed in the Japan Patent Office on Jul. 31, 2015. Each of the above-referenced applications is hereby incorporated herein by reference in its entirety.

TECHNICAL FIELD

The present disclosure relates to a solid-state image pickup device and an electronic apparatus, and particularly relates to a solid-state image pickup device and an electronic apparatus that allow the performance of a logarithmic sensor in a solar-cell mode to improve.

BACKGROUND ART

A logarithmic sensor that operates a photodiode in an open circuit similarly to a solar cell and measures an output voltage, has been known (refer to Non-Patent Document 1). This uses a relationship in which a potential difference, namely, a voltage occurring when a current flows in the forward direction of a PN junction, is proportional to the logarithm of the current. The current in the forward direction is replaced with a photocurrent generated by photoelectric conversion and the voltage in the forward direction of the PN junction is monitored, so that a signal including the photocurrent compressed logarithmically is acquired.

In addition, a solid-state image pickup device using the logarithmic sensor in the solar-cell mode, is also publicly known. A combination of the logarithmic sensor in the solar-cell mode and a typical storage-type CMOS image sensor by space division, has been proposed and a combination of the two by time division has been proposed. The reason why the combinations have been proposed, is that the logarithmic sensor in the solar-cell mode has dark and low-illuminance characteristics degraded.

Applying the structure of the logarithmic sensor in the solar-cell mode, to the structure of the typical storage-type CMOS image sensor corresponds to a structure having a photodiode (PD) contacted directly. In this case, the dark and low-illuminance characteristics degrade due to factors: kTC noise cannot be removed and an afterimage occurs since the PD cannot be depleted completely; white spots and a dark current attributable to an interface state degrade since pinning cannot be performed to a PD surface; and the like. These occur in an illuminance range before output enters a logarithmic region since the PN junction capacitance of the logarithmic sensor cannot be sufficiently charged.

For example, even in a case where the logarithmic sensor in the solar-cell mode and the typical storage-type CMOS image sensor are combined, the dark and low-illuminance characteristics of the logarithmic sensor in the solar-cell mode do not necessarily improve. Needless to say, the single logarithmic sensor has a problem remaining, and even for the combination, there is a need to ensure the transition period between a linear signal and a logarithmic output, so that the low-illuminance characteristic of the logarithmic sensor is required. In a case where a sufficient transition period is not provided, noise is noticeable in signal switching and thus there is a risk that image quality degrades.

In addition, the logarithmic sensor in the solar-cell mode is a sensor that monitors a photocurrent amount to output a signal, and thus no element to retain the signal is provided and no global shutter function has been achieved.

CITATION LIST

Non-Patent Document

Non-Patent Document 1: Yang Ni, YiMing Zhu, Bogdan Arion, A 768×576 Logarithmic Image Sensor with Photodiode in Solar Cell mode, International Image Sensor Workshop (IISW), lecture R35, Jun. 9, 2011

SUMMARY OF THE INVENTION

Problems to be Solved by the Invention

As described above, the performance of the logarithmic sensor in the solar-cell mode has still room for improvement in comparison to the typical storage-type CMOS image sensor, and thus is required to improve.

The present disclosure has been made in consideration of the situation, and is to enable the performance of a logarithmic sensor in a solar-cell mode to improve.

Solutions to Problems

A solid-state image pickup device according to one aspect of the present technology, includes: a plurality of unit pixels arranged regularly and two-dimensionally, each of the plurality of unit pixels including: a photodiode including a first semiconductor region having a first conductivity type and a second semiconductor region having a second conductivity type, the second semiconductor region having majority carrier concentration higher than majority carrier concentration of the first semiconductor region, the second conductivity type being a conductivity type opposite to the first conductivity type; a reset transistor configured to operate to reset the photodiode; an amplifier transistor electrically connected to the second semiconductor region; and a signal line connected with the amplifier transistor directly or through an active terminal; and a driving circuit configured to drive each of the plurality of unit pixels such that a reset level corresponding to a signal level output to the signal line is acquired in two states being a conducted state and a non-conducted state of the reset transistor.

In a case where sufficient incident light illuminance is provided, a reset level in the conducted state of the reset transistor is selected as the reset level corresponding to the signal level output to the signal line.

In a low-illuminance condition, a reset level in the non-conducted state of the reset transistor is selected as the reset level corresponding to the signal level output to the signal line.

A shutter driving period during which a shutter is driven, an exposure time during which exposure is performed, and a reading driving period during which a signal is read, are provided, and the driving circuit can acquire the reset level in the conducted state of the reset transistor in the reset level corresponding to the signal level output to the signal line, during the reading driving period.

The driving circuit can acquire the reset level in the non-conducted state of the reset transistor in the reset level corresponding to the signal level output to the signal line, during the reading driving period.

The driving circuit can acquire the reset level in the non-conducted state of the reset transistor in the reset level corresponding to the signal level output to the signal line, during the shutter driving period.

A shutter driving period during which a shutter is driven, an exposure time during which exposure is performed, and a reading driving period during which a signal is read, are provided, and the driving circuit can acquire the reset level in the conducted state of the reset transistor in the reset level corresponding to the signal level output to the signal line, during two periods being the shutter driving period and the reading driving period.

The driving circuit can acquire the reset level in the non-conducted state of the reset transistor in the reset level corresponding to the signal level output to the signal line, during the shutter driving period.

An electronic apparatus according to one aspect of the present technology, includes: a solid-state image pickup device including: a plurality of unit pixels arranged regularly and two-dimensionally, each of the plurality of unit pixels including: a photodiode including a first semiconductor region having a first conductivity type and a second semiconductor region having a second conductivity type, the second semiconductor region having majority carrier concentration higher than majority carrier concentration of the first semiconductor region, the second conductivity type being a conductivity type opposite to the first conductivity type; a reset transistor configured to operate to reset the photodiode; an amplifier transistor electrically connected to the second semiconductor region; and a signal line connected with the amplifier transistor directly or through an active terminal; and a driving circuit configured to drive each of the plurality of unit pixels such that a reset level corresponding to a signal level output to the signal line is acquired in two states being a conducted state and a non-conducted state of the reset transistor; a signal processing circuit configured to process an output signal output from the solid-state image pickup device; and an optical system configured to cause incident light to be incident on the solid-state image pickup device.

According to one aspect of the present technology, a plurality of unit pixels is arranged regularly and two-dimensionally, each of the plurality of unit pixels including: a photodiode including a first semiconductor region having a first conductivity type and a second semiconductor region having a second conductivity type, the second semiconductor region having majority carrier concentration higher than majority carrier concentration of the first semiconductor region, the second conductivity type being a conductivity type opposite to the first conductivity type; a reset transistor configured to operate to reset the photodiode; an amplifier transistor electrically connected to the second semiconductor region; and a signal line connected with the amplifier transistor directly or through an active terminal. Each of the plurality of unit pixels is driven such that a reset level corresponding to a signal level output to the signal line is acquired in two states being a conducted state and a non-conducted state of the reset transistor.

A solid-state image pickup device according to one aspect of the present technology, includes: a plurality of unit pixels arranged regularly and two-dimensionally, each of the plurality of unit pixels including: a photodiode including a first semiconductor region having a first conductivity type and a second semiconductor region having a second conductivity type, the second semiconductor region having majority carrier concentration higher than majority carrier concentration of the first semiconductor region, the second conductivity type being a conductivity type opposite to the first conductivity type; a reset transistor configured to operate to reset the photodiode; two staged amplifier transistors electrically connected to the second semiconductor region; a memory provided between the two staged amplifier transistors; and a selecting transistor connected with a rear-stage amplifier transistor and a signal line, the selecting transistor being configured to output data to the signal line in conduction; and a driving circuit configured to drive each of the plurality of unit pixels.

Each of the plurality of unit pixels can include a switching transistor corresponding to the memory, at a front stage of the memory.

The switching transistor is in conduction when the reset transistor is in both of a conducted state and a non-conducted state, during an exposure time during which exposure is performed, and the switching transistor is in a non-conducted state during a signal reading period being a time during which a signal retained in the memory is read.

The switching transistor can be in conduction when the reset transistor is in both of a conducted state and a non-conducted state, during an exposure time during which exposure is performed, and the switching transistor can be in conduction when the reset transistor and the selecting transistor each are in the conducted state, during a signal reading period being a time during which a signal retained in the memory is read.

Each of the plurality of unit pixels can include a plurality of the memories and a plurality of the switching transistors corresponding to the memories.

During an exposure time during which exposure is performed, a first switching transistor corresponding to a first memory, being connected to the second semiconductor region, can be in conduction when the reset transistor is in both of a conducted state and a non-conducted state, and a second switching transistor corresponding to a second memory, being connected to an output side of the first switching transistor, can be in conduction when the reset transistor is in the conducted state, and during a signal reading period being a time during which a signal retained in the memory is read, the first switching transistor can be in a non-conducted state, and the second switching transistor can be in conduction during a partial period when the reset transistor is in the non-conducted state and the selecting transistor is in the conducted state.

The memory is parasitic capacitance.
The memory is added capacitance.

An electronic apparatus according to one aspect of the present technology, includes: a solid-state image pickup device including: a plurality of unit pixels arranged regularly and two-dimensionally, each of the plurality of unit pixels including: a photodiode including a first semiconductor region having a first conductivity type and a second semiconductor region having a second conductivity type, the second semiconductor region having majority carrier concentration higher than majority carrier concentration of the first semiconductor region, the second conductivity type being a conductivity type opposite to the first conductivity type; a reset transistor configured to operate to reset the photodiode; two staged amplifier transistors electrically connected to the second semiconductor region; a memory provided between the two staged amplifier transistors; and a selecting transistor connected with a rear-stage amplifier transistor and a signal line, the selecting transistor being configured to output data to the signal line in conduction;

and a driving circuit configured to drive each of the plurality of unit pixels; a signal processing circuit configured to process an output signal output from the solid-state image pickup device; and an optical system configured to cause incident light to be incident on the solid-state image pickup device.

According to one aspect of the present technology, a plurality of unit pixels is arranged regularly and two-dimensionally, each of the plurality of unit pixels including: a photodiode including a first semiconductor region having a first conductivity type and a second semiconductor region having a second conductivity type, the second semiconductor region having majority carrier concentration higher than majority carrier concentration of the first semiconductor region, the second conductivity type being a conductivity type opposite to the first conductivity type; a reset transistor configured to operate to reset the photodiode; two staged amplifier transistors electrically connected to the second semiconductor region; and a selecting transistor connected with a rear-stage amplifier transistor and a signal line, the selecting transistor being configured to output data to the signal line in conduction. A memory is provided between the two staged amplifier transistors in the plurality of unit pixels.

Effects of the Invention

According to the present technology, the performance of the logarithmic sensor in the solar-cell mode can be improved.

Note that, the effects described in the present specification are just exemplifications. The effects of the present technology are not limited to the effects described in the present specification, and thus additional effects may be provided.

MODE FOR CARRYING OUT THE INVENTION

Modes for carrying out the present disclosure (hereinafter, referred to as embodiments) will be described below. Note that the descriptions will be given in the following order.
1. First Embodiment (Logarithmic Sensor in Solar-Cell Mode)
2. Second Embodiment (Global Shutter Function of Logarithmic Sensor in Solar-Cell Mode)
3. Third Embodiment (Exemplary Use of Image Sensor)
4. Fourth Embodiment (Exemplary Electronic Apparatus)

1. First Embodiment

<Exemplary Schematic Configuration of Solid-State Image Pickup Device>

Figure 1:
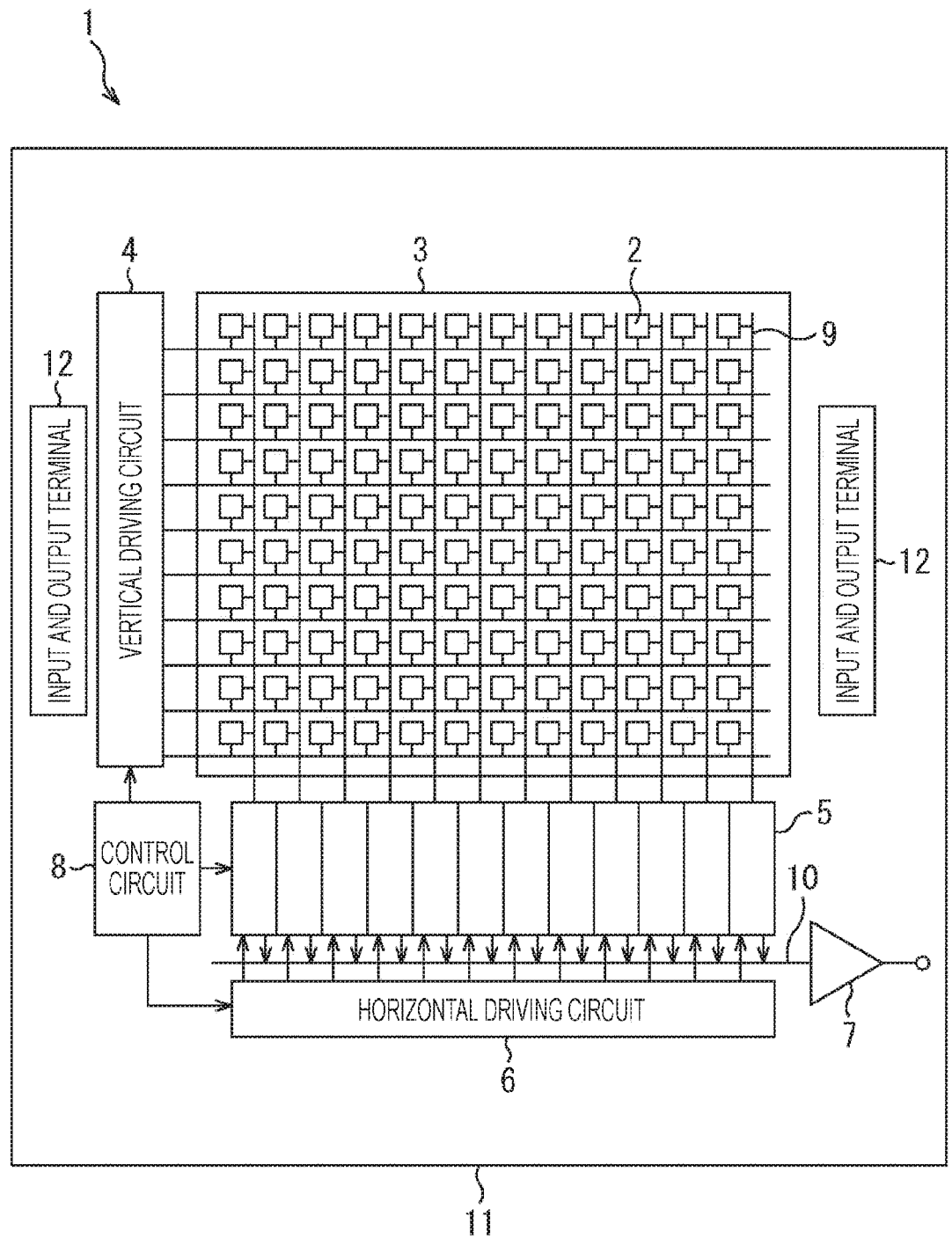
FIG. 1 is a block diagram illustrating an exemplary schematic configuration of a solid-state image pickup device to which the present technology has been applied.

FIG. 1 illustrates an exemplary schematic configuration of an exemplary complementary metal oxide semiconductor (CMOS) solid-state image pickup device to be applied to each embodiment of the present technology.

As illustrated in FIG. 1, the solid-state image pickup device (an element chip) 1 includes a pixel region (a so-called image pickup region) 3 and a peripheral circuit unit on a semiconductor substrate 11 (e.g., a silicon substrate), the pixel region 3 including a plurality of pixels 2 each including a photoelectric conversion element, arranged regularly and two-dimensionally.

The pixels 2 each have the photoelectric conversion element (e.g., a photodiode) and a plurality of pixel transistors (so-called MOS transistors). The plurality of pixel transistors can include, for example, three transistors: a selecting transistor, a reset transistor, and an amplifying transistor. The equivalent circuit of each of the pixels 2 (a unit pixel) is similar to a typical equivalent circuit, and thus the detailed description will be omitted here.

The peripheral circuit unit includes a vertical driving circuit 4, column signal processing circuits 5, a horizontal driving circuit 6, an output circuit 7, and a control circuit 8.

The control circuit 8 receives an input clock and data of a command for an operating mode, for example, and outputs data, such as internal information regarding the solid-state image pickup device 1. Specifically, the control circuit 8 generates a clock signal and a control signal, each being criteria for operating the vertical driving circuit 4, the column signal processing circuits 5, and the horizontal driving circuit 6, on the basis of a vertical synchronizing signal, a horizontal synchronizing signal, and a master clock. Then, the control circuit 8 inputs the signals into the vertical driving circuit 4, the column signal processing circuits 5, and the horizontal driving circuit 6.

The vertical driving circuit 4 includes, for example, a shift register, and selects a pixel driving line and supplies a pulse for driving the pixels 2, to the pixel driving line that has been selected, so that the pixels 2 are driven in a row unit. Specifically, the vertical driving circuit 4 sequentially and vertically selects and scans each of the pixels 2 in the pixel region 3 in the row unit, and then supplies a pixel signal to the column signal processing circuit 5 through a vertical signal line 9, the pixel signal being based on signal electric charge generated in accordance with an light-received amount in the photoelectric conversion element of each of the pixels 2.

Note that, in a global shutter function mode, the vertical driving circuit 4 selects all the pixel driving lines and drives all the pixels 2. Then, the vertical driving circuit 4 supplies a pixel signal to the column signal processing circuit 5 through the vertical signal line 9 in the row unit, the pixel signal being based on signal electric charge generated in accordance with a light-received amount in the photoelectric conversion element of each of the pixels 2.

The column signal processing circuits 5 are arranged, for example, corresponding to the columns of the pixels 2, and perform signal processing, such as noise reduction, to signals output from the pixels 2 for one row, corresponding to the pixel columns. Specifically, the column signal processing circuits 5 each perform signal processing, such as correlated double sampling (CDS), signal amplification, or analog/digital (A/D) conversion, for removing fixed pattern noise unique to the pixels 2. The output stage of each of the column signal processing circuits 5 is provided with a horizontal selection switch (not illustrated) connecting with a horizontal signal line 10.

The horizontal driving circuit 6 includes, for example, a shift register, and sequentially outputs a horizontal scanning pulse to select each of the column signal processing circuits 5 in a sequential order, so that each of the column signal processing circuits 5 outputs the pixel signal to the horizontal signal line 10.

The output circuit 7 performs signal processing to the signal sequentially supplied from each of the column signal processing circuits 5 through the horizontal signal line 10, and then outputs the signal. The output circuit 7 performs, for example, only buffering or performs, for example, black level adjustment, column variation correction, or various types of digital signal processing.

An input and output terminal 12 is provided to exchange signals externally.

<Exemplary Configuration of Pixel for Logarithmic Sensor in Solar-Cell Mode>

Figure 2:
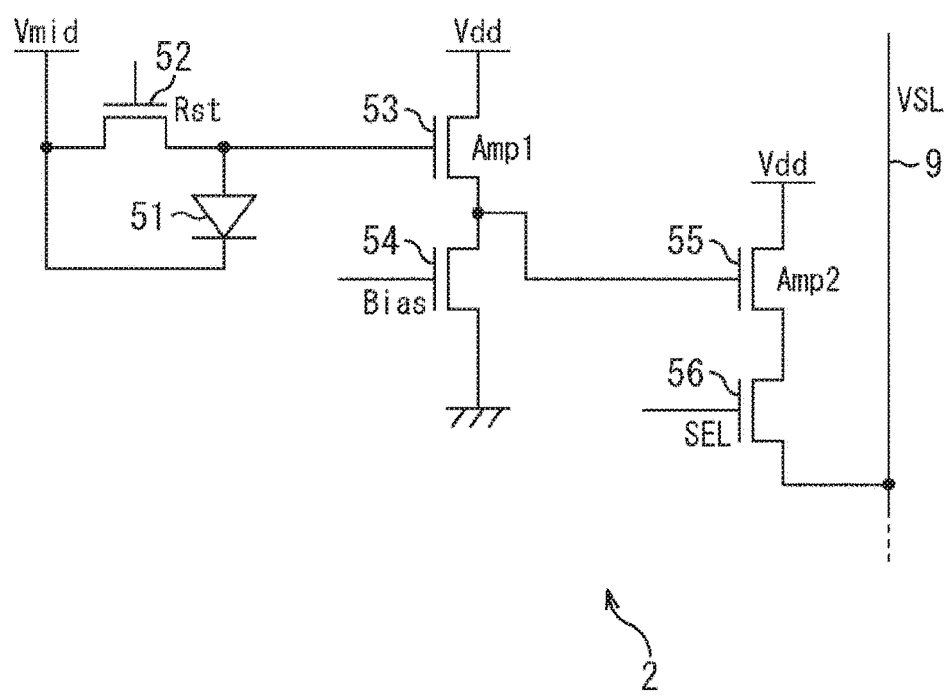
FIG. 2 is an equivalent circuit diagram illustrating an exemplary configuration of a pixel for a logarithmic sensor in a solar-cell mode.
Figure 3:
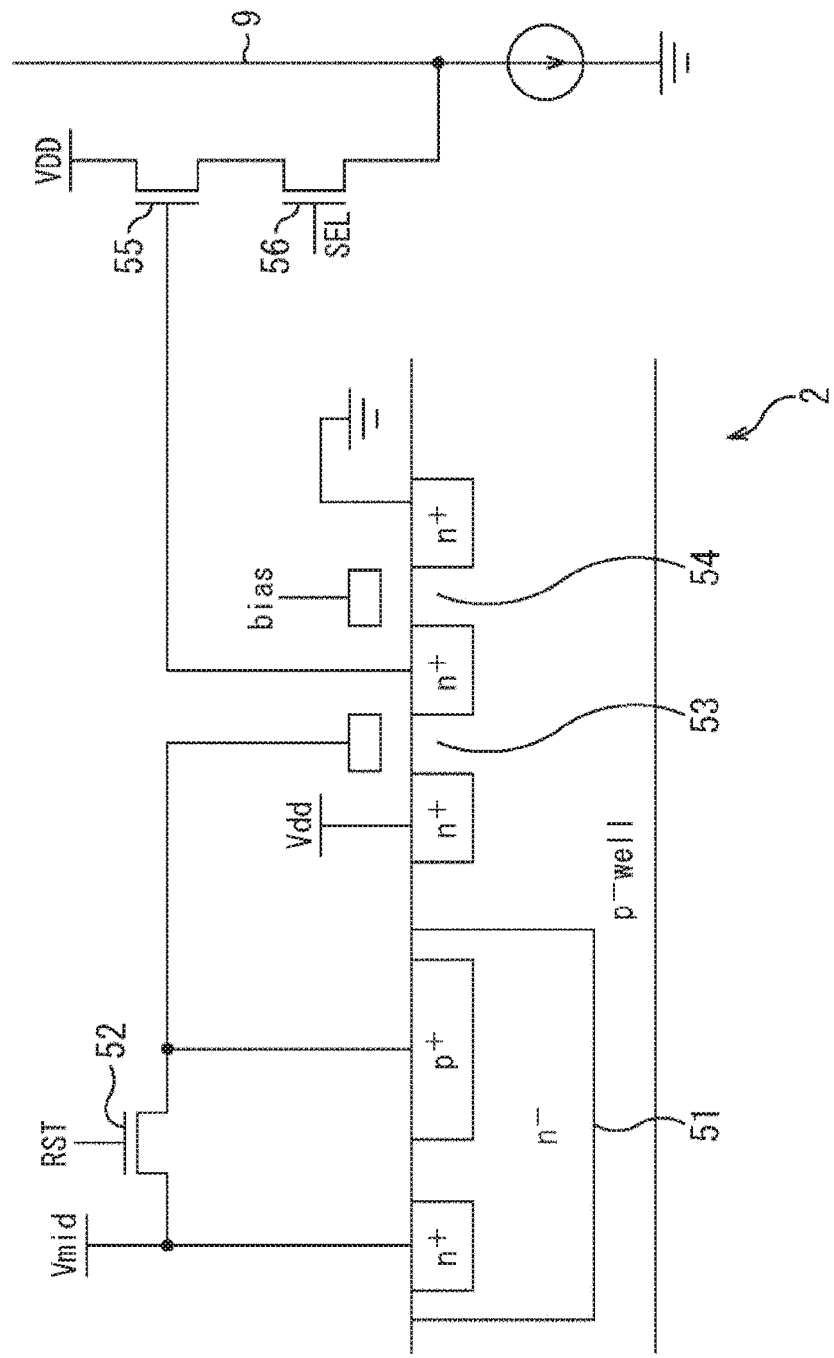
FIG. 3 is a sectional view illustrating the exemplary configuration of the pixel for the logarithmic sensor in the solar-cell mode.

FIGS. 2 and 3 are a diagram and a view illustrating an exemplary configuration of a pixel for a logarithmic sensor in a solar-cell mode. Note that, the logarithmic sensor described in the present specification is a logarithmic compression sensor utilizing a forward current of a PN junction, the logarithmic compression sensor having substantially no variation in a temperature characteristic. FIG. 2 is an equivalent circuit diagram, and FIG. 3 is a sectional view.

For the logarithmic sensor in the solar-cell mode, the pixel 2 of FIG. 1 includes a photodiode (a PN junction) 51, a reset transistor 52, an amplifier transistor 53, a bias transistor 54, an amplifier transistor 55, and a selecting transistor 56.

The photodiode 51 includes an N-type (first-conductivity-type) semiconductor region and a P-type (second-conductivity-type) semiconductor region higher in majority carrier concentration than the N type. The N-type semiconductor region of the photodiode 51 is connected with a midpoint potential Vmid and the drain of the reset transistor 52. The P-type semiconductor region of the photodiode 51 is connected with the source of the reset transistor 52 and the gate of the amplifier transistor 55.

The drain of the amplifier transistor 53 is connected with a power source voltage Vdd, and the source of the amplifier transistor 53 is connected with the drain of the bias transistor 54 and the gate of the amplifier transistor 55. The source of the bias transistor 54 is grounded.

The drain of the amplifier transistor 55 is connected with the power source voltage Vdd, and the source of the amplifier transistor 55 is connected with the drain of the selecting transistor 56. The source of the selecting transistor 56 is connected with the vertical signal line (VSL) 9.

The reset transistor 52 controls reset of the photodiode 51 in accordance with turning an RST signal ON or OFF. The amplifier transistor 53 and the amplifier transistor 55 amplify a signal from the photodiode 51, to output the signal to the amplifier transistor 55 and the selecting transistor 56, respectively. The bias transistor 54 sets a current to be a criterion. The selecting transistor 56 outputs the signal from the amplifier transistor 55 to the vertical signal line 9 in accordance with turning an SEL signal ON or OFF.

Note that, in the present specification below, turning a transistor ON means bringing the transistor into a conducted state (High) in which the transistor is in conduction, and turning the transistor OFF means bringing the transistor into a non-conducted state (Low).

<Typical Driving Method>

Figure 4:
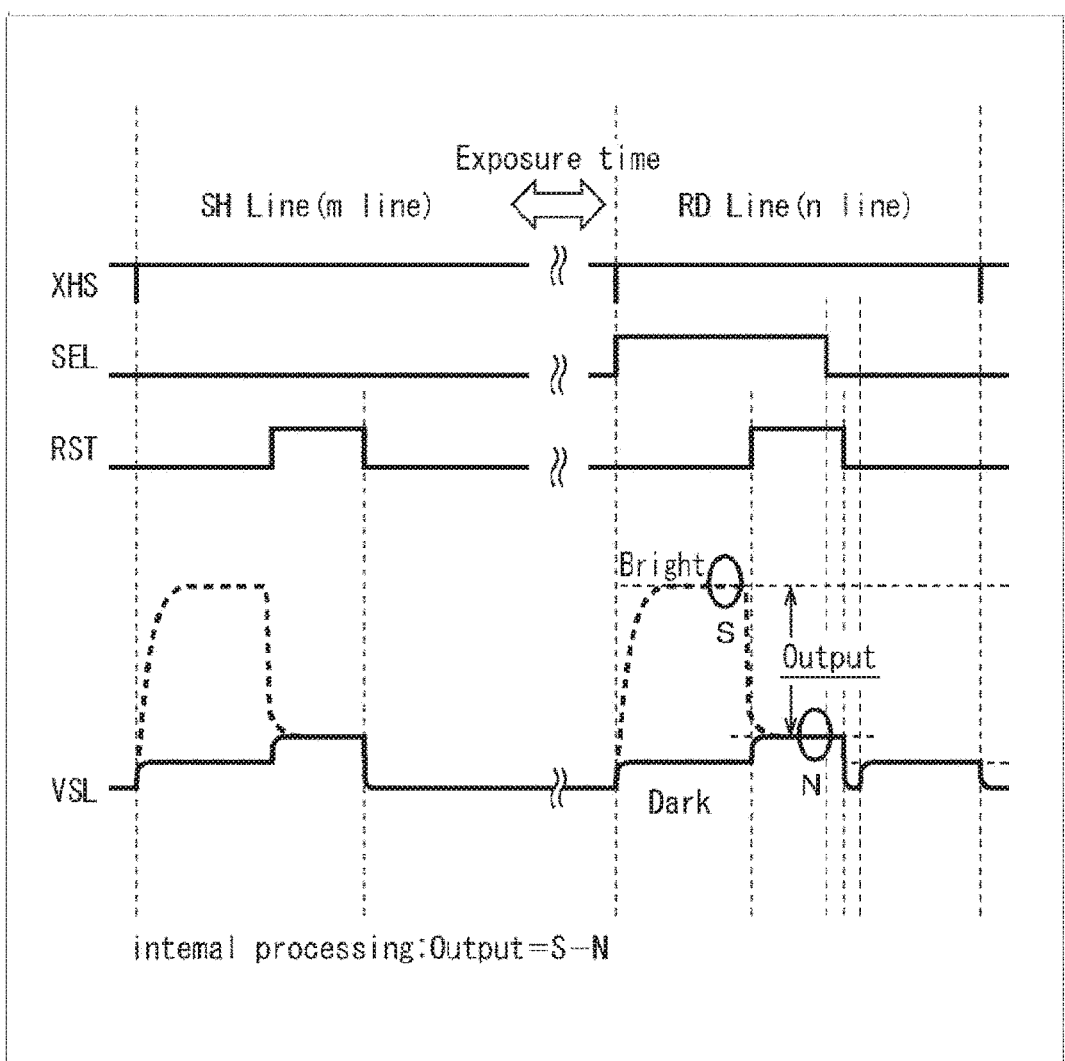
FIG. 4 is a timing chart expressing typical exemplary drive of the logarithmic sensor in the solar-cell mode.

FIG. 4 is a timing chart expressing typical exemplary drive of the logarithmic sensor in the solar-cell mode. In the example of FIG. 4, an SH Line (m line) driving period represents the shutter driving period of a horizontal m-th line, and an RD Line (n line) driving period represents read (reading) driving of a horizontal n-th line behind the m. A period until the RD Line driving period starts after the SH Line driving period, represents an exposure time.

XHS is a signal for selecting a row (a horizontal line) to be read, outside the pixels, the signal being constantly ON. SEL is a control signal to be input into the selecting transistor 56, the control signal controlling the selecting transistor 56 ON or OFF. RST is a control signal to be input into the reset transistor 52, the control signal controlling the reset transistor 52 ON or OFF. VSL represents electric charge charged in the photodiode (the PN junction) 51. Note that, the times and the signals are in a similar manner for the following timing charts.

Typically, the logarithmic sensor in the solar-cell mode outputs a linear signal (a signal proportional to the intensity of light) until the electric charge is charged in the photodiode 51), and a current exponentially flows with respect to a voltage occurring after the charging in the photodiode 51. Thus, the relationship between the voltage and the current becomes logarithmic, so that logarithmic output starts.

As illustrated in FIG. 4, after the electric charge is charged during the exposure time after the photodiode 51 is reset, Signal (S) is read and then a P-phase signal (N) is read in the conducted state in which the RST is ON. Note that, the P-phase signal is also referred to as a noise level, below. That is, when capacitance attributable to the photodiode 51 is charged in a case where sufficient incident light illuminance is provided (Bright), the logarithmic sensor outputs a signal including a photocurrent compressed logarithmically in equilibrium. In this case, S–N is output as an output signal (output), the S–N being the difference with respect to the noise level acquired in the conducted state in which the RST is ON. Here, the S is a signal level and the N is the noise level (a reset level for acquiring the difference) in the output signal.

Note that, in a case where the capacitance is insufficiently charged in a low-illuminance condition in which the incident light is less in amount (Dark), the logarithmic sensor outputs an accumulated signal being an uncompleted logarithmic output.

That is, in this case, potential varies, for example, in a case where the RST is turned OFF, in a case where capacitive coupling is made, or in a case where infusion is redundantly made, and thus kTC noise in a linear region is not removed completely unless the varied portion is added.

Therefore, according to the present technology, a noise level (N') for the low-illuminance signal, is acquired in addition to the noise level (N) for the logarithmic signal. In the low-illuminance condition in which the incident light is less in amount, the difference is acquired with S–N' after the RST is turned OFF, the S–N' including the kTC noise.

<First Driving Method>

Figure 5:
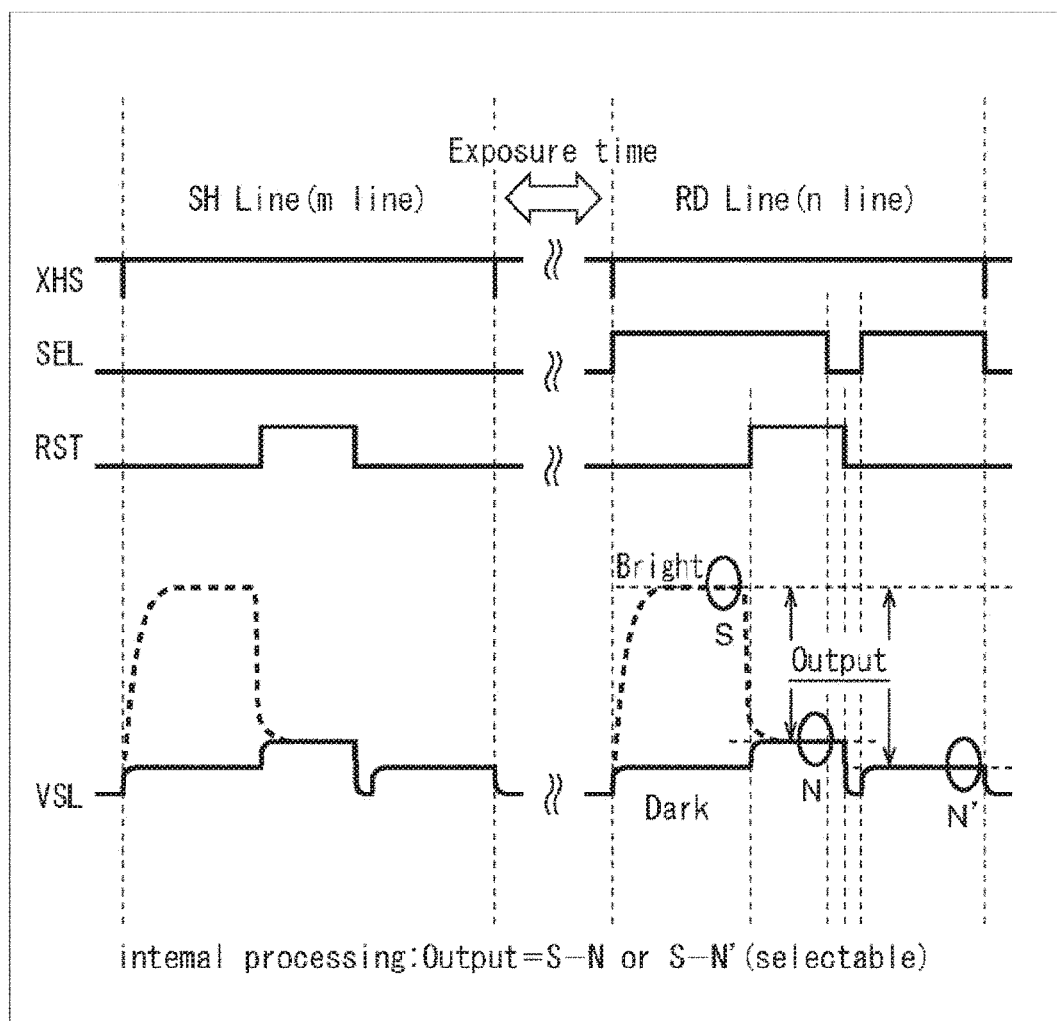
FIG. 5 is a timing chart illustrating an exemplary first driving method of the logarithmic sensor to which the present technology has been applied.

FIG. 5 is a timing chart illustrating an exemplary first driving method of the logarithmic sensor to which the present technology has been applied.

In the example of FIG. 5, after the Signal (S) is read, the noise level (N) is read in the conducted state in which the RST is ON. The noise level (N') is read in the non-conducted state in which the RST is OFF. Thus, in a case where the sufficient incident light illuminance is provided (Bright), the S–N is selected and output, the S–N being the difference with respect to the noise level acquired in the conducted state in which the RST is ON. In a case where the capacitance is insufficiently charged in the low-illuminance condition in which the incident light is less in amount (Dark), the S–N' is selected and output, the S–N' being the difference with respect to the noise level acquired in the conducted state in which the RST is OFF.

For the example, since no reading is required in the SH Line driving period, no frame memory is required, but an accumulated mode signal is to be double delta sampling (DDS).

<Second Driving Method>

Figure 6:
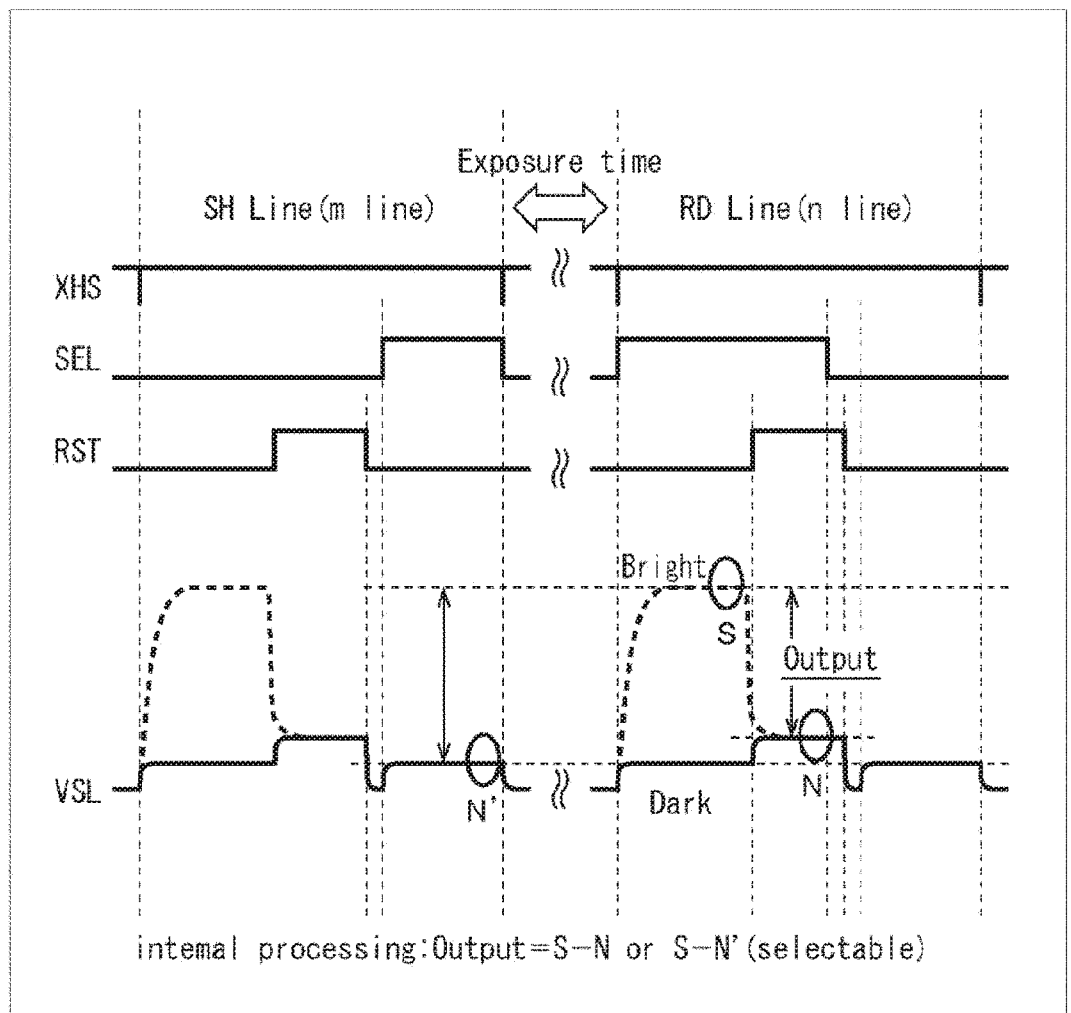
FIG. 6 is a timing chart illustrating an exemplary second driving method of the logarithmic sensor to which the present technology has been applied.

FIG. 6 is a timing chart illustrating an exemplary second driving method of the logarithmic sensor to which the present technology has been applied.

In the example of FIG. 6, the noise level (N') is read in the non-conducted state in which the RST is OFF, during the SH Line driving period. After the Signal (S) is read, the noise level (N) is read in the conducted state in which the RST is ON.

For the example, the frame memory is required, but the correlated double sampling (CDS) can be made with the accumulated mode signal, so that the kTC noise can be removed.

<Third Driving Method>

Figure 7:
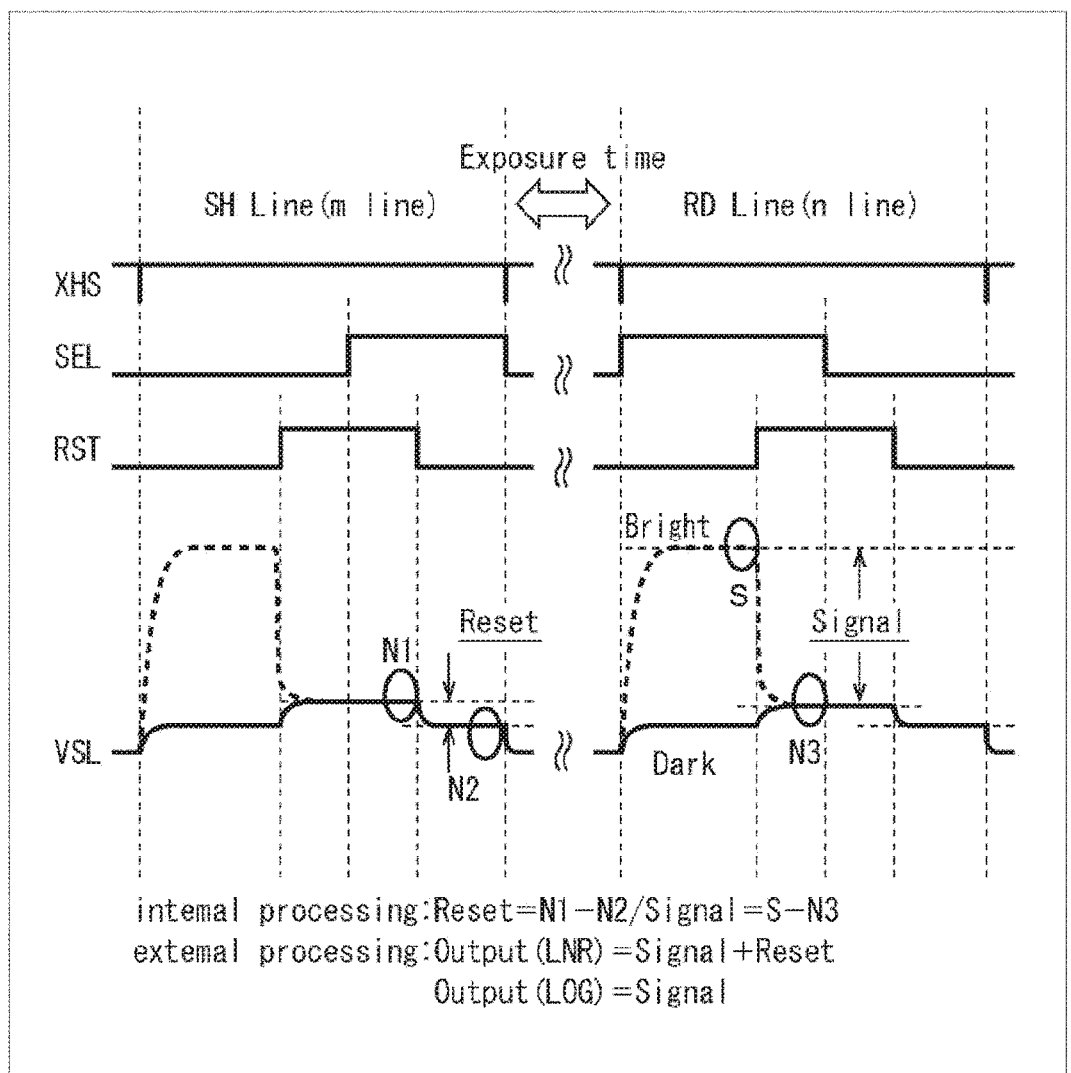
FIG. 7 is a timing chart illustrating an exemplary third driving method of the logarithmic sensor to which the present technology has been applied.

FIG. 7 is a timing chart illustrating an exemplary third driving method of the logarithmic sensor to which the present technology has been applied.

In the example of FIG. 7, a noise level (N1) is read in the conducted state in which the RST is ON, during the SH Line driving period. Additionally, a noise level (N3) is read in the conducted state in which the RST is ON, during the RD Line driving period. In addition, a noise level (N2) is read in the conducted state in which the RST is OFF, during the SH Line driving period.

The CDS is performed to each of the noise levels, and then a Reset signal=N1–N2 and a Signal signal=S–N3 are output. Then, an external signal processing circuit, for example, each of the column signal processing circuits 5 outputs the Signal signal+the Reset signal for linear output and outputs only the Signal signal for logarithmic output.

For the example, the signals to which the CDS is performed are close to each other in sampling time, and thus 1/f noise is inhibited. Meanwhile, the frame memory is required, and the kTC noise occurs between the N1 and the N3.

As described above, the P-phase signal being the noise level is acquired with the RST in each of the conducted state and the non-conducted state in the logarithmic sensor in the solar-cell mode, so that the performance of the logarithmic sensor can be improved. That is, the kTC noise can be removed not only in the logarithmic output state but also in the accumulated signal under the low-illuminance condition, so that the low-illuminance characteristic can be improved.

2. Second Embodiment

The logarithmic sensor in the solar-cell mode has been described in the descriptions above. The logarithmic sensor in the solar-cell mode is a sensor that monitors a photocurrent amount to output a signal, and thus no element to retain the signal is provided and no global shutter function has been achieved.

That is, the logarithmic sensor in the solar-cell mode monitors a photocurrent amount and has no element to retain a signal, and thus no global shutter function can be achieved yet. There is a risk that moving subject distortion or a flash band occurs in rolling shutter operation.

Therefore, according to the present technology, capacitance being a memory is added inside a logarithmic sensor so that the memory retains a current signal as a voltage signal. The signal that has been retained is sequentially read, so that the performance of the logarithmic sensor can be improved. That is, the global shutter function can be achieved. With this arrangement, there is no risk that the moving subject distortion or the flash band occurs in the rolling shutter operation, so that image quality improves.

<Exemplary Configuration of Pixel in Global Shutter Function>

Figure 8:
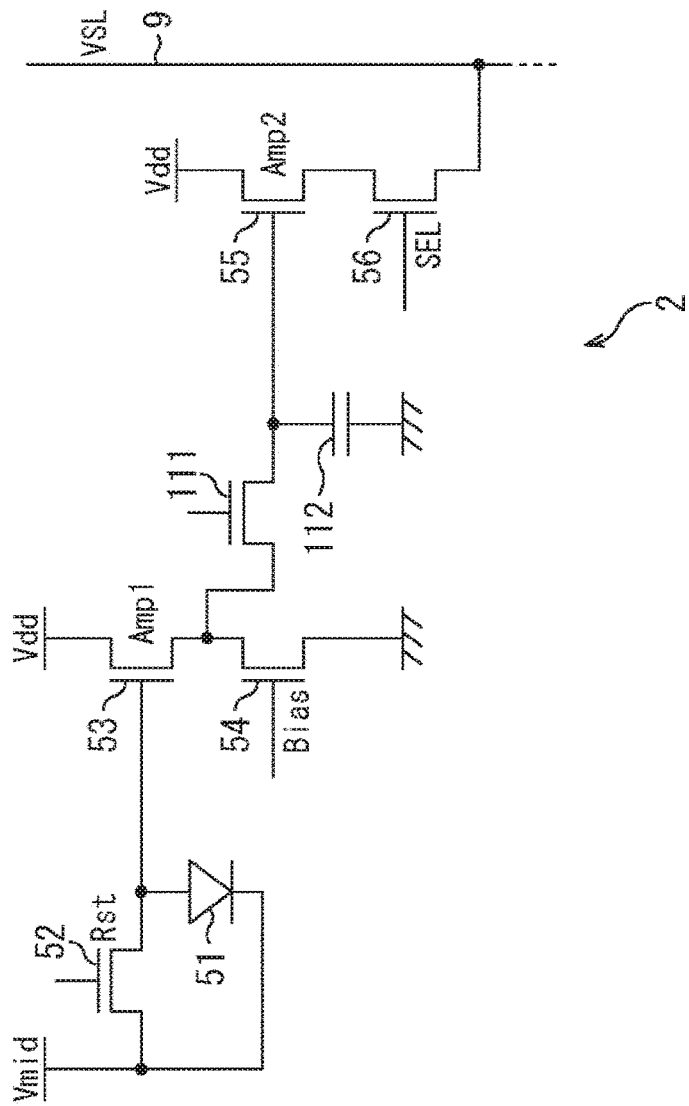
FIG. 8 is an equivalent circuit diagram illustrating an exemplary configuration of a pixel for a logarithmic sensor in a solar-cell mode to which the present technology has been applied.

FIG. 8 is an equivalent circuit diagram illustrating an exemplary configuration of a pixel for a logarithmic sensor in a solar-cell mode to which the present technology has been applied.

The pixel 2 of FIG. 8 is common with the pixel 2 of FIG. 2 in that a photodiode (a PN junction) 51, a reset transistor 52, an amplifier transistor 53, a bias transistor 54, an amplifier transistor 55, and a selecting transistor 56 are included.

In addition, the pixel 2 of FIG. 8 is different from the pixel 2 of FIG. 2 in that a switching transistor 111 and a memory 112 are added between two staged amplifier transistors, namely, between the amplifier transistor 53 and the amplifier transistor 55.

That is, the switching transistor 111 is turned ON during an exposure period during which exposure is performed, so that the memory 112 accumulates a voltage signal from the amplifier transistor 53. The switching transistor 111 remains OFF during a signal reading period during which the signal that has been accumulated is read, so that the voltage signal accumulated in the memory 112 is read when the selecting transistor 56 is ON and the signal that has been read is output to a vertical signal line 9 through the amplifier transistor 55 and the selecting transistor 56.

The memory 112 includes the input node of the amplifier transistor 55 to be floating due to the switching transistor 111, utilized as a memory, and retains a signal. That is, the carriers occurring in the photodiode 51 and the polarity of the switching transistor 111 are reversed, so that the input node (parasitic capacitance) can perform retention as a memory.

Figure 9:
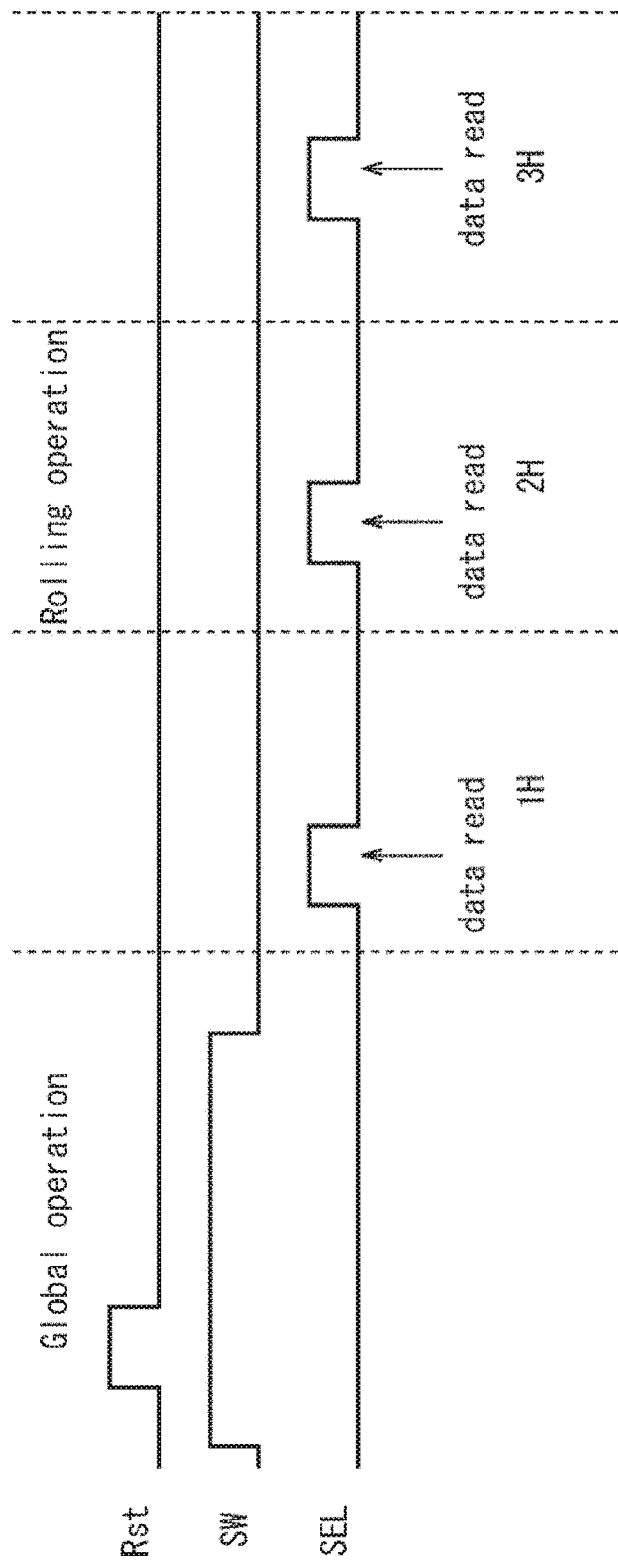
FIG. 9 is a timing chart illustrating an exemplary driving sequence for the pixel of FIG. 8.

FIG. 9 is a timing chart illustrating an exemplary driving sequence for the pixel 2 of FIG. 8. The example of FIG. 9 indicates, as global driving, an exposure period during which exposure is performed and, as rolling driving, signal retention in the memory 112 and a signal reading period during which reading from the memory 112 is performed.

Here, Rst represents an Rst signal to be input into the reset transistor 52, the Rst signal being ON or OFF. SW represents an SW signal to be input into the switching transistor 111, the SW being ON or OFF. SEL represents an SEL signal to be input into the selecting transistor 56, the SEL signal being ON or OFF. Note that, unless otherwise mentioned, the periods and the signals are in a similar manner for the following timing charts.

With simultaneous exposure performed during the exposure period, turning the SW signal ON turns the reset transistor 52 ON and turning the Rst signal OFF turns the reset transistor 52 OFF from the ON state, so that a current signal from the photodiode 51 is written as a voltage signal into the memory 112. After the writing, turning the SW signal OFF turns the switching transistor 111 OFF. Then, per 1H (horizontal signal line) during the signal reading period, turning the SEL signal ON turns the selecting transistor 56 ON and the signal written in the memory 112 is read, so that the signal is output to the vertical signal line 9.

In this case, pipeline driving of performing exposure for the next frame, can be made during the signal reading period. Meanwhile, since reset cannot be performed due to the performance of the exposure, P-phase reading cannot be performed.

Figure 10:
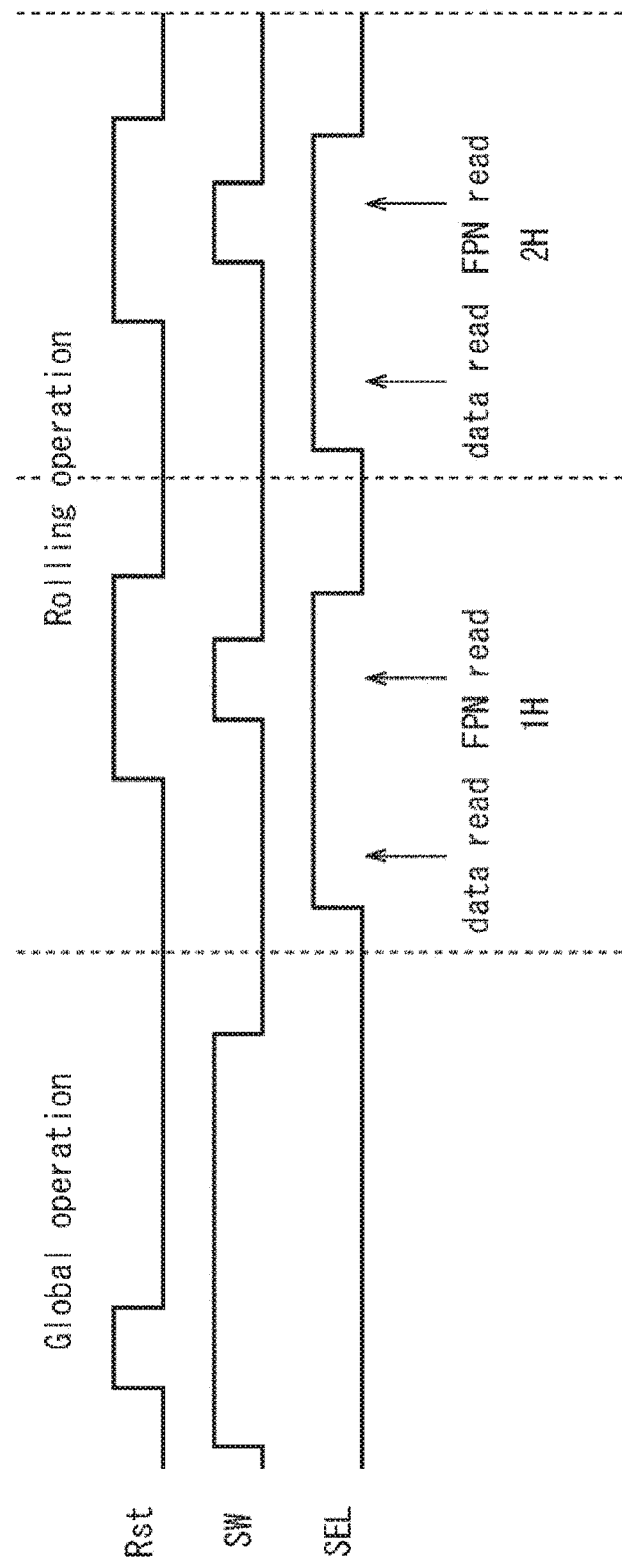
FIG. 10 is a timing chart illustrating an exemplary driving sequence in a case where P phase reading is performed.

FIG. 10 is a timing chart illustrating an exemplary driving sequence in a case where the P-phase reading is performed.

The exposure period in the example of FIG. 10 is similar to that in the example of FIG. 9. Per 1H (horizontal signal line) during the signal reading period, turning the SEL signal ON turns the selector transistor 111 ON, so that the signal written in the memory 112 is read to be output to the vertical signal line 9. After that, reset is once performed including retained capacitance, and the P-phase reading is performed. That is, P-phase fixed pattern noise (FPN) is read when turning the Rst signal ON turns the reset transistor 52 ON, turning the SW signal ON turns the switching transistor 111 ON, and turning the SEL signal ON turns the selecting transistor 56 ON.

In this case, the FPN can be removed, but the pipeline driving in the example of FIG. 9 is difficult to perform.

<Different Exemplary Configuration of Pixel in Global Shutter Function>

Figure 11:
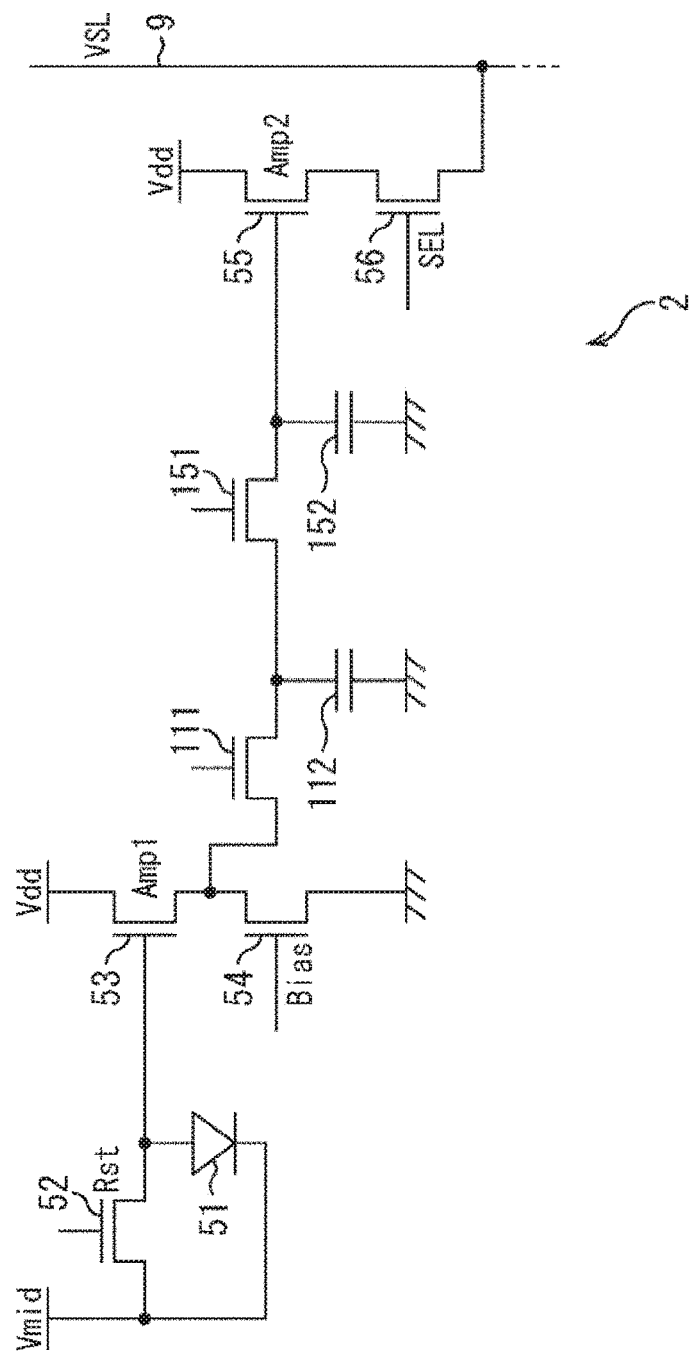
FIG. 11 is an equivalent circuit diagram illustrating an exemplary configuration of a pixel for the logarithmic sensor in the solar-cell mode to which the present technology has been applied.

FIG. 11 is an equivalent circuit diagram illustrating an exemplary configuration of a pixel for the logarithmic sensor in the solar-cell mode to which the present technology has been applied.

The pixel 2 of FIG. 11 is in common with the pixel 2 of FIG. 8 in that the photodiode (a PN junction) 51, the reset transistor 52, the amplifier transistor 53, the bias transistor 54, the amplifier transistor 55, the selecting transistor 56, the switching transistor 111, and the memory 112 are included.

In addition, the pixel 2 of FIG. 11 is different from the pixel 2 of FIG. 8 in that a switching transistor 151 and a memory 152 are further added between two staged amplifier transistors, namely, between the amplifier transistor 53 and the amplifier transistor 55.

That is, turning the switching transistor 151 ON simultaneously with the switching transistor 111 during an exposure period, accumulates, as a voltage signal, a P-phase current signal from the amplifier transistor 53 into the memory 152. Turning the switching transistor 151 OFF when the switching transistor 111 is ON during the exposure period, accumulates, as a voltage signal, a D-phase current signal from the amplifier transistor 53 into the memory 112.

In addition, retaining the switching transistor 151 in the OFF state when the selecting transistor 56 is ON during a signal reading period, reads P-phase FPN accumulated in the memory 152, and then the FPN that has been read is output to a vertical signal line 9 through the amplifier transistor 55 and the selecting transistor 56. Furthermore, turning the switching transistor 151 ON when the selecting transistor 56 is ON during the signal reading period, reads D-phase data accumulated in the memory 152, and then the data that has been read is output to the vertical signal line 9 through the amplifier transistor 55 and the selecting transistor 56.

Similarly to the memory 112, the memory 152 includes the input node of the amplifier transistor 55 to be floating due to the switching transistor 151, utilized as a memory, and retains a signal. That is, the carriers occurring in the photodiode 51 and the polarity of the switching transistor 151 are reversed, so that the input node can perform retention as a memory.

Figure 12:
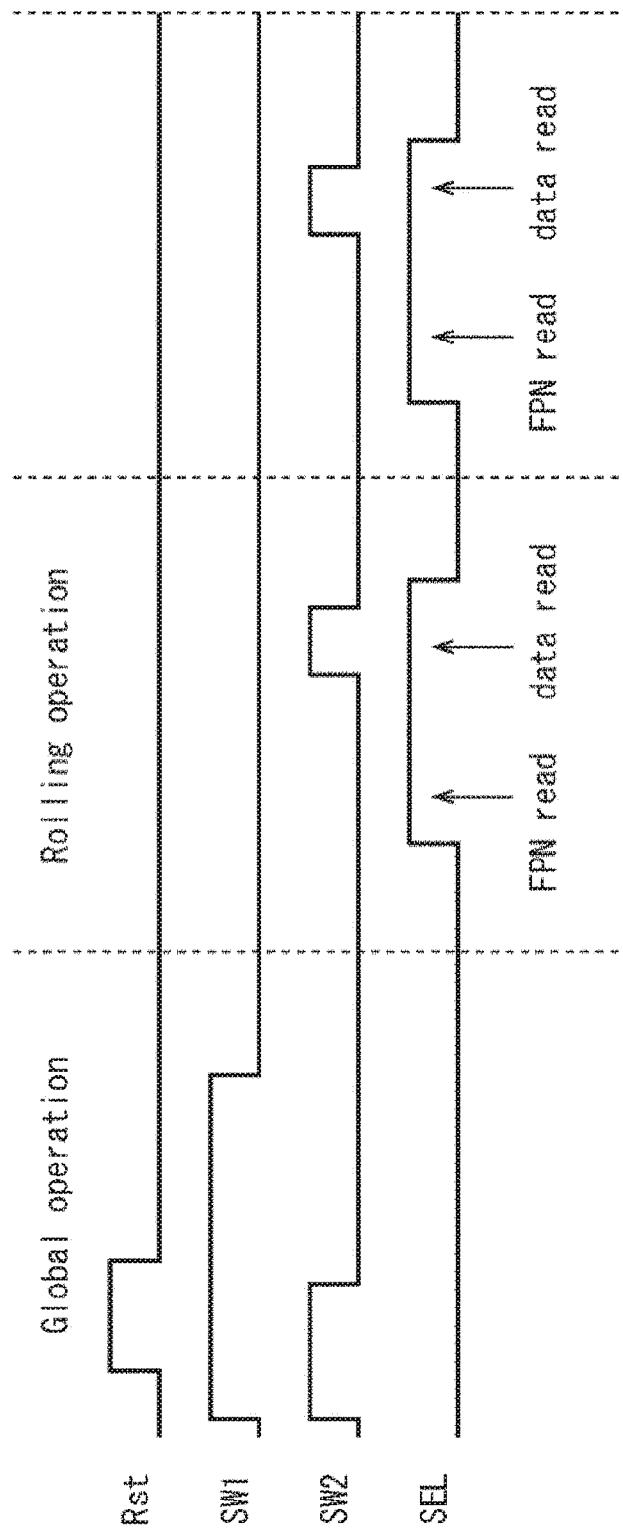
FIG. 12 is a timing chart illustrating an exemplary driving sequence for the pixel of FIG. 11.

FIG. 12 is a timing chart illustrating an exemplary driving sequence for the pixel 2 of FIG. 11. Note that, in the example of FIG. 12, SW1 represents an SW signal to be input into the switching transistor 111, the SW signal being ON or OFF, and SW2 represents an SW signal to be input into the switching transistor 151, the SW signal being ON or OFF.

With simultaneous exposure performed during the exposure period, when turning the SW1 signal and the SW2 signal ON turns the switching transistor 111 and the switching transistor 151 ON and turning an Rst signal ON turns the reset transistor 52 ON, the P-phase current signal from the photodiode 51 is written, as the voltage signal, into the memory 152. When turning the SW2 signal OFF turns the switching transistor 151 OFF and turning the Rst signal OFF turns the reset transistor 52 OFF, the D-phase current signal from the photodiode 51 is written, as the voltage signal, into the memory 112.

Per 1H (horizontal signal line) during the signal reading period, turning the SEL signal ON turns the selecting transistor 56 ON, so that the P-phase FPN written in the memory 152 is read to be output to the vertical signal line 9. Turning the SW2 signal ON turns the switching transistor 151 ON when turning the SEL signal ON turns the selecting transistor 56 ON, so that the D-phase data written in the memory 112 is read to be output to the vertical signal line 9.

In this case, both of the signals are stored during the exposure period and the P-phase signal and the D-phase signal each are sequentially read with the switching being made during the signal reading period. Thus, both of the P-phase reading and the D-phase reading can be performed with the pipeline driving being performed.

As described above, according to the present technology, a memory is added between the two staged amplifier transistors in the logarithmic sensor in the solar-cell mode such that a current signal is retained as a voltage signal. Thus, the global shutter function can be achieved in the logarithmic sensor that monitors a current. With this arrangement, the noise can be inhibited.

Note that, the example in which parasitic capacitance is used for the memories 112 and 152, has been given in the above descriptions, but another memory may be added. The parasitic capacitance is small in capacitance, and thus is short in writing time. In contrast to this, in a case where addition is made, since the capacitance is large, the writing time becomes long, but the noise seems relatively small.

In addition, the present technology described in the first embodiment can be applied to the logarithmic sensor in the solar-cell mode according to the second embodiment. In other words, the technology described in the second embodiment can be applied to the logarithmic sensor in the solar-cell mode described in the first embodiment. With this arrangement, the global shutter function can be achieved in the logarithmic sensor having the low-illuminance characteristic improved. In addition, the low-illuminance characteristic can be improved in the global shutter function.

In addition, the configuration in which the present technology has been applied to the CMOS solid-state image pickup device, has been described in the above, but the present technology may be applied to a solid-state image pickup device, such as a charge coupled device (CCD) solid-state image pickup device.

As described above, according to the present technology, the performance of the logarithmic sensor in the solar-cell mode can be improved. That is, according to the present technology, inhibiting the noise can improve the low-illuminance characteristic in the logarithmic sensor in the solar-cell mode. In addition, that is, according to the present technology, adding the capacitance can achieve the global shutter function. The global shutter function can inhibit the noise.

3. Third Embodiment

Figure 13:
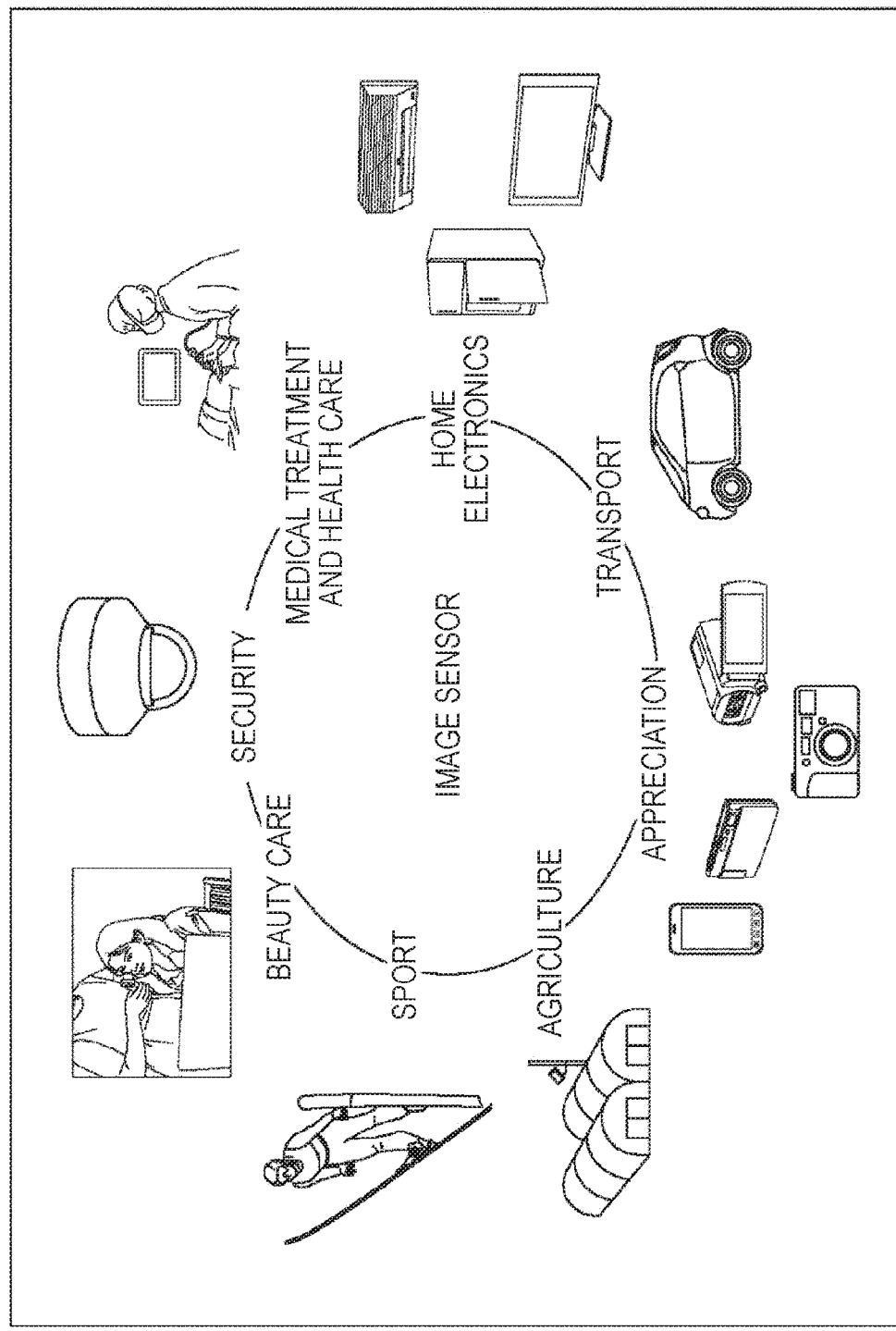
FIG. 13 is a diagram illustrating exemplary use of an image sensor to which the present technology has been applied.

FIG. 13 is a diagram illustrating exemplary use in which the solid-state image pickup device described above is used.

The solid-state image pickup device described above (an image sensor) can be used, for example, in various cases in which sensing is performed to light, such as visible light, infrared light, ultraviolet light, and X rays, as described below.

- Devices each shooting an image to be used for appreciation, the devices such as a digital camera and a mobile apparatus having a camera function.
- Devices to be used for transport, such as an in-vehicle sensor that shoots such as the front, rear, periphery, or inside of an automobile for driving safety, such as automatic stop, or for recognition of the state of a driver and the like, a surveillance camera that monitors traveling vehicles and roads, and a ranging sensor that measures, for example, the distance between vehicles.
- Devices to be used for home electronics, such as a TV, a refrigerator, and an air conditioner, the devices each shooting a gesture of a user so as to perform an apparatus operation in accordance with the gesture.
- Devices to be used for medical treatment and health care, such as an endoscope and a device that shoots a blood vessel with reception of infrared light.
- Devices to be used for security, such as a surveillance camera for crime prevention and a camera for person authentication.
- Devices to be used for beauty care, such as a skin measuring instrument that shoots skin and a microscope that shoots scalp.
- Devices to be used for sport, such as an action camera and a wearable camera for sport and the like.
- Devices to be used for agriculture, such as a camera for monitoring the state of a field or crops.

4. Fourth Embodiment

<Exemplary Configuration of Electronic Apparatus>

The present technology is not limited to the application to the solid-state image pickup device, and thus can be further applied to an image pickup device. Here, the image pickup device is referred to as an electronic apparatus, for example, a camera system, such as a digital still camera or a digital video camera, or a mobile phone having an image pickup function. Note that a modular mode to be mounted on the electronic apparatus, namely, a camera module may be the image pickup device.

Here, an exemplary configuration of an electronic apparatus according to the present technology will be described with reference to FIG. 14.

Figure 14:
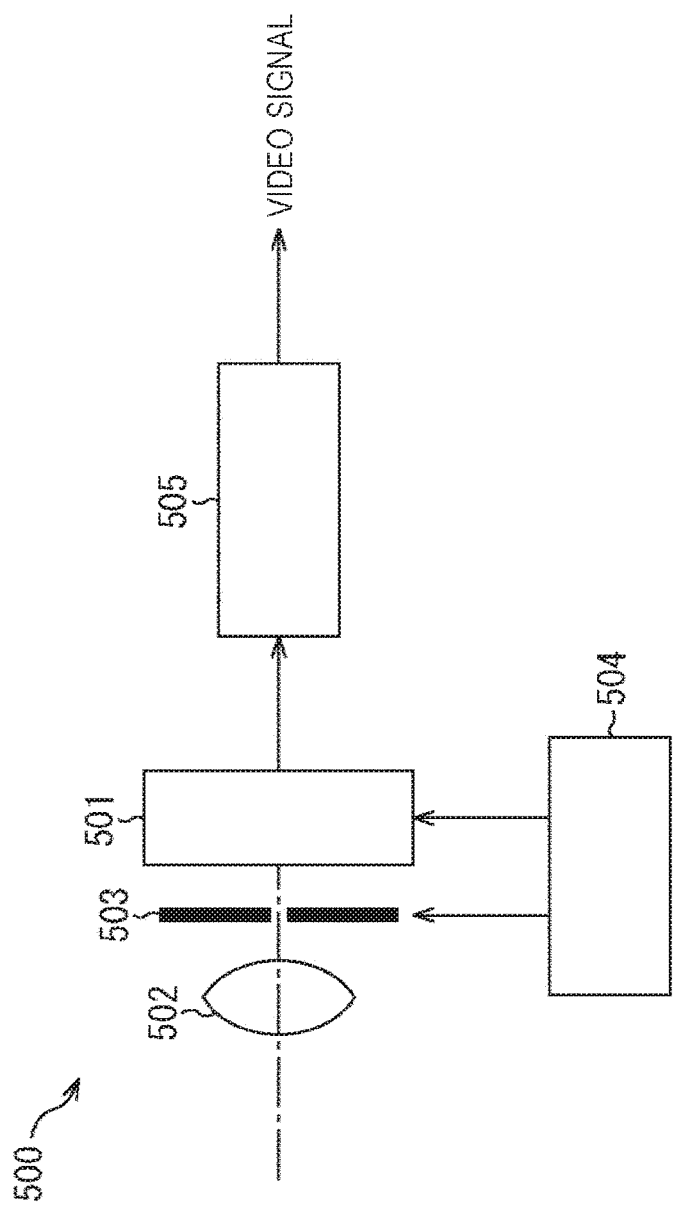
FIG. 14 is a block diagram illustrating an exemplary configuration of an electronic apparatus to which the present technology has been applied.

The electronic apparatus 500 illustrated in FIG. 14, includes a solid-state image pickup device (an element chip) 501, an optical lens 502, a shutter device 503, a driving circuit 504, and a signal processing circuit 505. The solid-state image pickup device 1 according to the present technology described above is provided as the solid-state image pickup device 501. With this arrangement, the performance of a logarithmic sensor in a solar-cell mode can be improved. That is, for example, in a case where, as the solid-state image pickup device 501, the solid-state image pickup device 501 of the electronic apparatus 500 according to the first embodiment of the present technology described above is the logarithmic sensor in the solar-cell mode, a low-illuminance characteristic can be improved. Meanwhile, the solid-state image pickup device 1 according to the second embodiment of the present technology described above is provided as the solid-state image pickup device 501. With this arrangement, in a case where the solid-state image pickup device 501 of the electronic apparatus 500 is the logarithmic sensor in the solar-cell mode, a global shutter function can be achieved.

The optical lens 502 image-forms image light (incident light) from a subject, onto the image pickup surface of the solid-state image pickup device 501. With this arrangement, signal electric charge is accumulated inside the solid-state image pickup device 501 for a certain period. The shutter device 503 controls a light irradiation period and a light shield period for the solid-state image pickup device 501.

The driving circuit 504 supplies driving signals to control the signal transferring operation of the solid-state image pickup device 501 and the shutter operation of the shutter device 503. The solid-state image pickup device 501 performs signal transferring with the driving signal (a timing signal) supplied from the driving circuit 504. The signal processing circuit 505 performs various types of signal processing to the signal output from the solid-state image pickup device 501. A video signal to which the signal processing has been performed, is stored in a storage medium, such as a memory, or is output to a monitor.

Note that, in the present specification, the steps describing the set of processing described above, include not only the processing performed on the basis of time series in the described order but also the processing performed in parallel or individually even when the processing is not necessarily performed on the basis of the time series.

In addition, the embodiments in the present disclosure are not limited to the embodiments described above, and thus various alterations can be made without departing from the scope of the spirit of the present disclosure.

In addition, a configuration described above as one device (or one processing unit) may be divided to form a plurality of devices (or processing units). Conversely, configurations described above as a plurality of devices (or processing units) may be collectively formed to form one device (or one processing unit). In addition, the configuration of each device (or each processing unit) may be added with a configuration other than the configurations described above. Furthermore, if the configuration or the operation of the entire system remains substantially the same, the configuration of a device (or a processing unit) may be partially included in the configuration of a different device (or a different processing unit). That is, the present technology is not limited to the embodiments described above, and thus various alterations can be made without departing from the scope of the spirit of the present technology.

The preferred embodiments of the present disclosure have been described in detail above with reference to the attached drawings, but the disclosure is not limited to the examples. It is obvious that a person skilled in the technical field to which the present disclosure belongs may conceive various alterations or modifications in the scope of the technical idea described in the claims, and thus it is understood that these rightfully belong to the technical scope of the present disclosure.

Note that the present technology can also have the following configurations.

(1) A solid-state image pickup device includes:
a plurality of unit pixels arranged regularly and two-dimensionally, each of the plurality of unit pixels including:
a photodiode including a first semiconductor region having a first conductivity type and a second semiconductor region having a second conductivity type, the second semiconductor region having majority carrier concentration higher than majority carrier concentration of the first semiconductor region, the second conductivity type being a conductivity type opposite to the first conductivity type;
a reset transistor configured to operate to reset the photodiode;
an amplifier transistor electrically connected to the second semiconductor region; and
a signal line connected with the amplifier transistor directly or through an active terminal; and
a driving circuit configured to drive each of the plurality of unit pixels such that a reset level corresponding to a signal level output to the signal line is acquired in two states being a conducted state and a non-conducted state of the reset transistor.

(2) The solid-state image pickup device according to (1), in which, in a case where sufficient incident light illuminance is provided, a reset level in the conducted state of the reset transistor is selected as the reset level corresponding to the signal level output to the signal line.

(3) The solid-state image pickup device according to (1) or (2), in which, in a low-illuminance condition, a reset level in the non-conducted state of the reset transistor is selected as the reset level corresponding to the signal level output to the signal line.

(4) The solid-state image pickup device according to any of (1) to (3), in which
a shutter driving period during which a shutter is driven, an exposure time during which exposure is performed, and a reading driving period during which a signal is read, are provided, and
the driving circuit acquires the reset level in the conducted state of the reset transistor in the reset level corresponding to the signal level output to the signal line, during the reading driving period.

(5) The solid-state image pickup device according to (4), in which the driving circuit acquires the reset level in the non-conducted state of the reset transistor in the reset level corresponding to the signal level output to the signal line, during the reading driving period.

(6) The solid-state image pickup device according to (4), in which the driving circuit acquires the reset level in the non-conducted state of the reset transistor in the reset level corresponding to the signal level output to the signal line, during the shutter driving period.

(7) The solid-state image pickup device according to any of (1) to (3), in which
a shutter driving period during which a shutter is driven, an exposure time during which exposure is performed, and a reading driving period during which a signal is read, are provided, and
the driving circuit acquires the reset level in the conducted state of the reset transistor in the reset level corresponding to the signal level output to the signal line, during two periods being the shutter driving period and the reading driving period.

(8) The solid-state image pickup device according to (7), in which the driving circuit acquires the reset level in the non-conducted state of the reset transistor in the reset level corresponding to the signal level output to the signal line, during the shutter driving period.

(9) An electronic apparatus includes:
a solid-state image pickup device including:
a plurality of unit pixels arranged regularly and two-dimensionally, each of the plurality of unit pixels including:
a photodiode including a first semiconductor region having a first conductivity type and a second semiconductor region having a second conductivity type, the second semiconductor region having majority carrier concentration higher than majority carrier concentration of the first semiconductor region, the second conductivity type being a conductivity type opposite to the first conductivity type;
a reset transistor configured to operate to reset the photodiode;
an amplifier transistor electrically connected to the second semiconductor region; and
a signal line connected with the amplifier transistor directly or through an active terminal; and
a driving circuit configured to drive each of the plurality of unit pixels such that a reset level corresponding to a signal level output to the signal line is acquired in two states being a conducted state and a non-conducted state of the reset transistor;
a signal processing circuit configured to process an output signal output from the solid-state image pickup device; and
an optical system configured to cause incident light to be incident on the solid-state image pickup device.

(10) A solid-state image pickup device includes:
a plurality of unit pixels arranged regularly and two-dimensionally, each of the plurality of unit pixels including:
a photodiode including a first semiconductor region having a first conductivity type and a second semiconductor region having a second conductivity type, the second semiconductor region having majority carrier concentration higher than majority carrier concentration of the first semiconductor region, the second conductivity type being a conductivity type opposite to the first conductivity type;
a reset transistor configured to operate to reset the photodiode;
two staged amplifier transistors electrically connected to the second semiconductor region;
a memory provided between the two staged amplifier transistors; and
a selecting transistor connected with a rear-stage amplifier transistor and a signal line, the selecting transistor being configured to output data to the signal line in conduction; and
a driving circuit configured to drive each of the plurality of unit pixels.

(11) The solid-state image pickup device according to (10), in which each of the plurality of unit pixels includes a switching transistor corresponding to the memory, at a front stage of the memory.

(12) The solid-state image pickup device according to (11), in which the switching transistor is in conduction when the reset transistor is in both of a conducted state and a non-conducted state, during an exposure time during which exposure is performed, and the switching transistor is in a non-conducted state during a signal reading period being a time during which a signal retained in the memory is read.

(13) The solid-state image pickup device according to (11), in which the switching transistor is in conduction when the reset transistor is in both of a conducted state and a non-conducted state, during an exposure time during which exposure is performed, and the switching transistor is in conduction when the reset transistor and the selecting transistor each are in the conducted state, during a signal reading period being a time during which a signal retained in the memory is read.

(14) The solid-state image pickup device according to (11), in which each of the plurality of unit pixels includes a plurality of the memories and a plurality of the switching transistors corresponding to the memories.

(15) The solid-state image pickup device according to (14), in which during an exposure time during which exposure is performed, a first switching transistor corresponding to a first memory, being connected to the second semiconductor region, is in conduction when the reset transistor is in both of a conducted state and a non-conducted state, and a second switching transistor corresponding to a second memory, being connected to an output side of the first switching transistor, is in conduction when the reset transistor is in the conducted state, and during a signal reading period being a time during which a signal retained in the memory is read, the first switching transistor is in a non-conducted state, and the second switching transistor is in conduction during a partial period when the reset transistor is in the non-conducted state and the selecting transistor is in the conducted state.

(16) The solid-state image pickup device according to any of (10) to (15), in which the memory is parasitic capacitance.

(17) The solid-state image pickup device according to any of (10) to (15), in which the memory is added capacitance.

(18) An electronic apparatus includes:
a solid-state image pickup device including:
a plurality of unit pixels arranged regularly and two-dimensionally, each of the plurality of unit pixels including:
a photodiode including a first semiconductor region having a first conductivity type and a second semiconductor region having a second conductivity type, the second semiconductor region having majority carrier concentration higher than majority carrier concentration of the first semiconductor region, the second conductivity type being a conductivity type opposite to the first conductivity type;
a reset transistor configured to operate to reset the photodiode;
two staged amplifier transistors electrically connected to the second semiconductor region;
a memory provided between the two staged amplifier transistors; and
a selecting transistor connected with a rear-stage amplifier transistor and a signal line, the selecting transistor being configured to output data to the signal line in conduction; and
a driving circuit configured to drive each of the plurality of unit pixels;
a signal processing circuit configured to process an output signal output from the solid-state image pickup device; and
an optical system configured to cause incident light to be incident on the solid-state image pickup device.

REFERENCE SIGNS LIST

1 Solid-state image pickup device
2 Pixel
4 Vertical driving circuit
6 Horizontal driving circuit
8 Control circuit
9 Vertical signal line
51 Photodiode
52 Reset transistor
53 Amplifier transistor
54 Bias transistor
55 Amplifier transistor
56 Selecting transistor
111 Switching transistor
112 Memory
151 Switching transistor
152 Memory
500 Electronic apparatus
501 Solid-state image pickup device
502 Optical lens
503 Shutter device
504 Driving circuit
505 Signal processing circuit

The invention claimed is:
1. A solid-state image pickup device, comprising:
a plurality of unit pixels in a two-dimensional arrangement, wherein each unit pixel of the plurality of unit pixels includes:
a photodiode including a first semiconductor region having a first conductivity type and a second semiconductor region having a second conductivity type, wherein
the second semiconductor region has a majority carrier concentration higher than a majority carrier concentration of the first semiconductor region, and
the second conductivity type is opposite to the first conductivity type;
a reset transistor configured to reset the photodiode;
an amplifier transistor configured to electrically connect to the second semiconductor region; and
a signal line connected with the amplifier transistor one of directly or through an active terminal; and
a driving circuit configured to:
drive each unit pixel of the plurality of unit pixels; and
acquire a reset level that corresponds to a signal level output to the signal line, wherein
the reset level is acquired in one of a conducted state of the reset transistor or a non-conducted state of the reset transistor,
the reset level is acquired in the conducted state based on illuminance that is above a threshold, and
the illuminance is of incident light that is incident on the solid-state image pickup device.

2. The solid-state image pickup device according to claim 1, wherein the reset level is acquired in the non-conducted state of the reset transistor based on the illuminance being less than the threshold.

3. The solid-state image pickup device according to claim 1, wherein
a shutter driving period is a period in which a shutter is driven,
an exposure time is a period in which exposure is executed,
a reading driving period is a period in which a signal is read, and
the driving circuit is further configured to acquire, in the reading driving period, the reset level in the conducted state of the reset transistor in the reset level corresponding to the signal level output to the signal line.

4. The solid-state image pickup device according to claim 3, wherein the driving circuit is further configured to acquire, in the reading driving period, the reset level in the non-conducted state of the reset transistor in the reset level corresponding to the signal level output to the signal line.

5. The solid-state image pickup device according to claim 3, wherein the driving circuit is further configured to acquire, in the shutter driving period, the reset level in the non-conducted state of the reset transistor in the reset level corresponding to the signal level output to the signal line.

6. The solid-state image pickup device according to claim 1, wherein
a shutter driving period is a period in which a shutter is driven,
an exposure time is a period in which exposure is executed,
a reading driving period is a period in which a signal is read,
the driving circuit is further configured to acquire, during two periods, the reset level in the conducted state of the reset transistor in the reset level corresponding to the signal level output to the signal line, and
the two periods include the shutter driving period and the reading driving period.

7. The solid-state image pickup device according to claim 6, wherein the driving circuit is further configured to acquire, during the shutter driving period, the reset level in the non-conducted state of the reset transistor in the reset level corresponding to the signal level output to the signal line.

8. An electronic apparatus, comprising:
a solid-state image pickup device including:
a plurality of unit pixels in a two-dimensional arrangement, wherein each unit pixel of the plurality of unit pixels includes:
a photodiode including a first semiconductor region having a first conductivity type and a second semiconductor region having a second conductivity type, wherein
the second semiconductor region has a majority carrier concentration higher than a majority carrier concentration of the first semiconductor region, and
the second conductivity type is opposite to the first conductivity type;
a reset transistor configured to reset the photodiode;
an amplifier transistor configured to electrically connect to the second semiconductor region; and
a signal line connected with the amplifier transistor one of directly or through an active terminal; and
a driving circuit configured to:
drive each unit pixel of the plurality of unit pixels; and
acquire a reset level that corresponds to a signal level output to the signal line, wherein
the reset level is acquired in one of a conducted state of the reset transistor or a non-conducted state of the reset transistor,
the reset level is acquired in the conducted state based on illuminance of incident light that is incident on the solid-state image pickup device, and
the illuminance is above a threshold;
a signal processing circuit configured to process an output signal output from the solid-state image pickup device; and
an optical system configured to cause the incident light to be incident on the solid-state image pickup device.

9. A solid-state image pickup device, comprising:
a plurality of unit pixels in a two-dimensional arrangement, wherein each unit pixel of the plurality of unit pixels includes:
a photodiode including a first semiconductor region having a first conductivity type and a second semiconductor region having a second conductivity type, wherein
the second semiconductor region has a majority carrier concentration higher than a majority carrier concentration of the first semiconductor region, and
the second conductivity type is opposite to the first conductivity type;
a reset transistor configured to reset the photodiode;
two staged amplifier transistors comprising a first amplifier transistor and a second amplifier transistor, wherein
the first amplifier transistor is configured to electrically connect to the second semiconductor region, and
the second amplifier transistor is proximal to a signal line than the first amplifier transistor;
a first memory between the first amplifier transistor and the second amplifier transistor;
a selecting transistor connected with the second amplifier transistor and the signal line, wherein the selecting transistor is configured to output data to the signal line in conduction; and
a switching transistor corresponding to the first memory, wherein
the switching transistor is in conduction based on a conducted state of the reset transistor and a non-conducted state of the reset transistor,
the conduction of the switching transistor is in an exposure time in which exposure is executed,
the conduction of the switching transistor in a signal reading period is based on the conducted state of the reset transistor and a conducted state of the selecting transistor, and
the signal reading period is a time in which a signal retained in the first memory is read; and
a driving circuit configured to drive each unit pixel of the plurality of unit pixels.

10. The solid-state image pickup device according to claim 9, wherein each unit pixel of the plurality of unit pixels includes the switching transistor at a front stage of the first memory.

11. The solid-state image pickup device according to claim 10, wherein each unit pixel of the plurality of unit pixels includes:
- a plurality of memories including the first memory, and
- a plurality of switching transistors corresponding to the plurality of memories.

12. The solid-state image pickup device according to claim 11, wherein
in the exposure time in which the exposure is executed:
- a first switching transistor, of the plurality of switching transistors, corresponding to a second memory of the plurality of memories is in conduction based on the conducted state of the reset transistor and the non-conducted state of the reset transistor,
- the first switching transistor is connected to the second semiconductor region,
- a second switching transistor, of the plurality of switching transistors, corresponding to a third memory of the plurality of memories is in conduction based on the conducted state of the reset transistor, and
- the second switching transistor is connected to an output side of the first switching transistor, and in the signal reading period in which the signal retained in the first memory is read:
- the first switching transistor is in a non-conducted state, and
- the second switching transistor is in conduction in a partial period based on:
  - the reset transistor that is in the non-conducted state, and
  - the selecting transistor that is in the conducted state.

13. The solid-state image pickup device according to claim 9, wherein the first memory is parasitic capacitance.

14. The solid-state image pickup device according to claim 9, wherein the first memory is added capacitance.

15. An electronic apparatus, comprising:
a solid-state image pickup device including:
- a plurality of unit pixels in a two-dimensional arrangement, wherein each unit pixel of the plurality of unit pixels includes:
  - a photodiode including a first semiconductor region having a first conductivity type and a second semiconductor region having a second conductivity type, wherein
    the second semiconductor region has a majority carrier concentration higher than a majority carrier concentration of the first semiconductor region, and
    the second conductivity type is opposite to the first conductivity type;
  - a reset transistor configured to reset the photodiode;
  - two staged amplifier transistors comprising a first amplifier transistor and a second amplifier transistor, wherein
    the first amplifier transistor is configured to electrically connect to the second semiconductor region, and
    the second amplifier transistor is proximal to a signal line than the first amplifier transistor;
  - a memory between the first amplifier transistor and the second amplifier transistor;
  - a selecting transistor connected with the second amplifier transistor and the signal line, wherein the selecting transistor is configured to output data to the signal line in conduction; and
  - a switching transistor corresponding to the memory, wherein
    the switching transistor is in conduction based on a conducted state of the reset transistor and a non-conducted state of the reset transistor,
    the conduction of the switching transistor is in an exposure time in which exposure is executed,
    the conduction of the switching transistor in a signal reading period is based on the conducted state of the reset transistor and a conducted state of the selecting transistor, and
    the signal reading period is a time in which a signal retained in the memory is read;
- a driving circuit configured to drive each unit pixel of the plurality of unit pixels;
- a signal processing circuit configured to process an output signal output from the solid-state image pickup device; and
an optical system configured to cause incident light to be incident on the solid-state image pickup device.

* * * * *